United States Patent
Sherman et al.

(10) Patent No.: US 11,127,855 B2
(45) Date of Patent: Sep. 21, 2021

(54) LATERAL DIFFUSED METAL OXIDE SEMICONDUCTOR FIELD EFFECT (LDMOS) TRANSISTOR AND DEVICE HAVING LDMOS TRANSISTORS

(71) Applicant: Tower Semiconductors Ltd., Migdal Haemek (IL)

(72) Inventors: Daniel Sherman, Haifa (IL); Sagy Levy, Zichron-Yaakov (IL); David Mistele, Migdal Haemek (IL)

(73) Assignee: Tower Semiconductors Ltd., Migdal Haemek (IL)

( * ) Notice: Subject to any disclaimer, the term of this patent is extended or adjusted under 35 U.S.C. 154(b) by 0 days.

(21) Appl. No.: 16/423,188

(22) Filed: May 28, 2019

(65) Prior Publication Data
US 2020/0381553 A1    Dec. 3, 2020

(51) Int. Cl.
*H01L 29/78*       (2006.01)
*H01L 29/66*       (2006.01)
*H01L 29/417*      (2006.01)
*H01L 29/06*       (2006.01)

(52) U.S. Cl.
CPC ...... *H01L 29/7816* (2013.01); *H01L 29/0634* (2013.01); *H01L 29/0649* (2013.01); *H01L 29/41758* (2013.01); *H01L 29/66681* (2013.01)

(58) Field of Classification Search
CPC ............ H01L 29/7816; H01L 29/0634; H01L 29/66681; H01L 29/0649; H01L 29/41758
See application file for complete search history.

(56) References Cited

U.S. PATENT DOCUMENTS

| | | | |
|---|---|---|---|
| 2006/0057784 A1* | 3/2006 | Cai | H01L 29/66659 438/149 |
| 2013/0087828 A1* | 4/2013 | Koshimizu | H01L 21/76224 257/139 |
| 2014/0070315 A1* | 3/2014 | Levy | H01L 27/0617 257/343 |

* cited by examiner

*Primary Examiner* — Marcos D. Pizarro
*Assistant Examiner* — Sue Tang
(74) *Attorney, Agent, or Firm* — Reches Patent (57) ABSTRACT

A LDMOS transistor that may include (i) a first region that is a reduced surface field (RESURF) implant region of a first type; (ii) a second region that is a RESURF implant region of a second type, wherein the first type differs from the second type; (iii) a gate; (iv) a stepped oxide region and a gate oxide region that are positioned above the first region and below the gate. Each one of the first region and the second region has a substantially uniform thickness

10 Claims, 6 Drawing Sheets

LATERAL DIFFUSED METAL OXIDE SEMICONDUCTOR FIELD EFFECT (LDMOS) TRANSISTOR AND DEVICE HAVING LDMOS TRANSISTORS

BACKGROUND OF THE INVENTION

A BCD (Bipolar, CMOS, DMOS) fabrication process allows to provide an integrated circuit that may include a combination of bipolar transistors, complementary metal-oxide-semiconductor (CMOS) transistors and laterally diffused metal-oxide-semiconductor (LDMOS) transistors.

The BCD fabrication process may be used for various purposes—for example for providing high power switches. Such high power switches may be used in various circuits—such as but not limited to DC to DC power converters.

High power switches require low on-resistance and high voltage breakdown.

A drift and accumulation regions of a typical LDMOS may have reduced surface field (RESURF) implants to achieve low on resistance and high voltage breakdown.

An active region of a typical LDMOS transistor may end with a shallow trench isolation (STI) region.

An LDMOS transistor may have multiple fingers and STI regions are located between the fingers. The STI regions between rows or in the termination causes the charge balance and electrostatics to deviates from an optimum point, particularly when employing RESURF implants Consequently, impairing the overall performance, usually reducing the electrical breakdown voltage, especially in low depth RESURF implants for voltages up to around 60 volts.

An LDMOS transistor may include oxide regions that penetrate the silicon surface (such as STI) and reduce the LDMOS transistor reliability. High currents and voltages in the surrounding of the penetrated oxide are prone to create more traps and slow down the LDMOS transistor.

There is a growing need to improve the performance of a power convertors, specifically by lowering the resistance and increasing the breakdown voltage of integrated LDMOS transistors.

SUMMARY

According to an embodiment of the invention there may be provided an LDMOS transistor and a device that includes LDMOS transistors.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

There may be provided an LDMOS transistor, a device that includes LDMOS transistors and a method. The device may be a driver, a DC to DC converter, be manufactured by a BCD fabrication process, be any other device or may be fabricated by a fabrication process that differs from the BCD fabrication process.

The LDMOS transistor includes a first region that is a reduced surface field (RESURF) implant region of a first type and a second region that is a RESURF implant region of a second type, wherein the first type differs from the second type. The first region may include shallow n-type doping and the second region may include a deep p-type doping. The LDMOS transistor may also include a stepped oxide that preserve substantially the charge balance in all device directions, including the (width) W-direction termination and in-between rows. Preserving the charge balance is beneficial and may contribute to a better utilization of the device area, or reducing the resistance per area, and it may also allow an ideal optimization without specifically accounting for termination effects.

Substantially may include an insignificant deviations of up to 1-2 percent and the like.

The first and second regions may maintain their substantial uniform thickness in all directions. The LDMOS transistor may include multiple fingers that may include one or more instances of the first region and the second region. The substantially uniform thickness may be maintained throughout the multiple LDMOS transistor fingers. For example—the substantial uniform thickness of the first and second regions may be maintained at all directions, including at a termination in the W-direction and in between rows.

A bottom surface of the stepped oxide and a bottom surface of a gate oxide may contact a first surface of the first region. A small contact region may introduce an insignificant penetration in the first region.

The substantial constant electrostatic profile is obtained by using the stepped oxide region and the gate oxide that surround the second and first regions, spacing apart the STI region from the second and first regions, minimizing the penetration in the first region and having a substantial uniform thickness of the first region and the second region.

Figure 1:
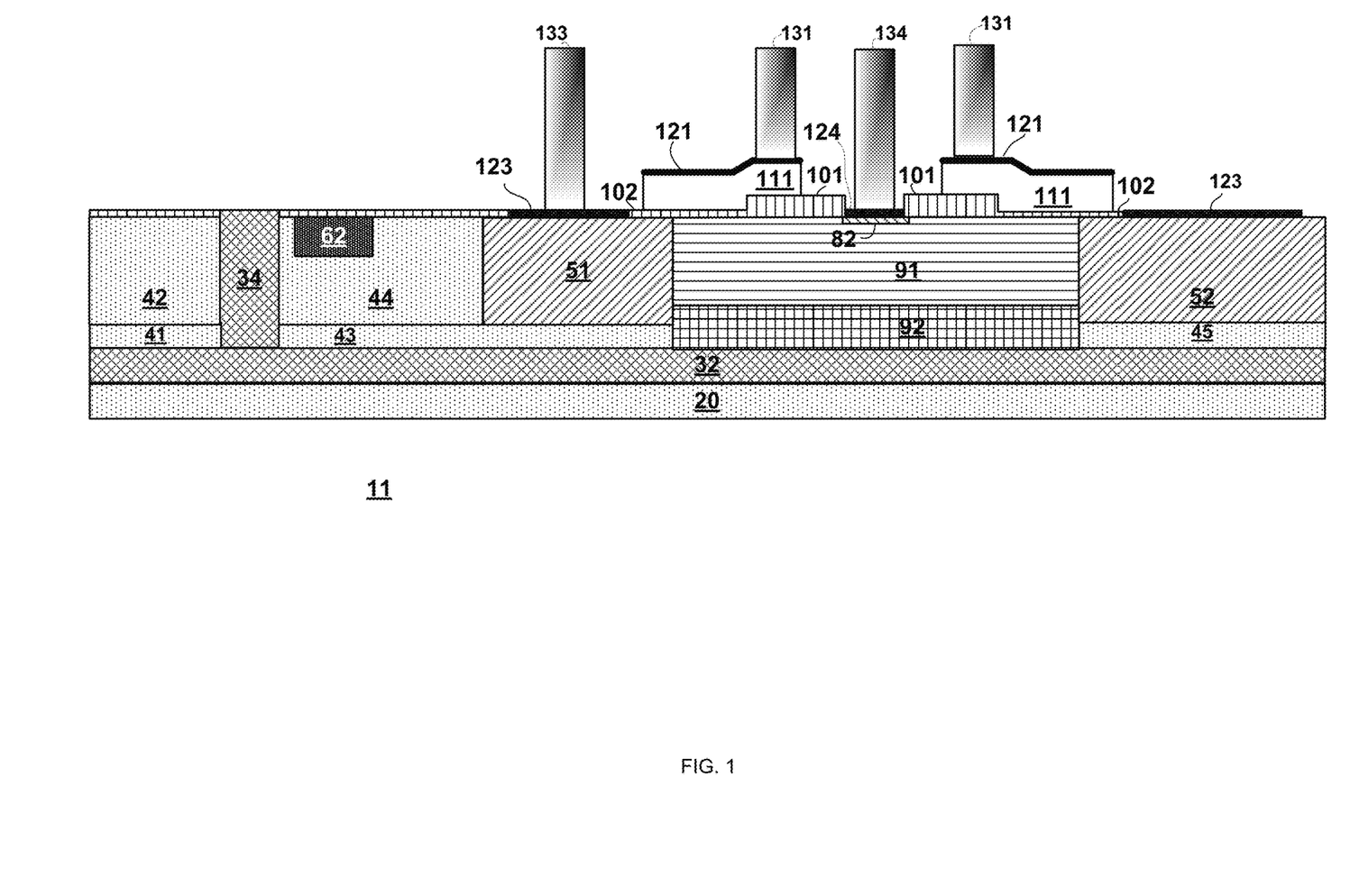
FIG. 1 is example of a part of a semiconductor device.
Figure 2:
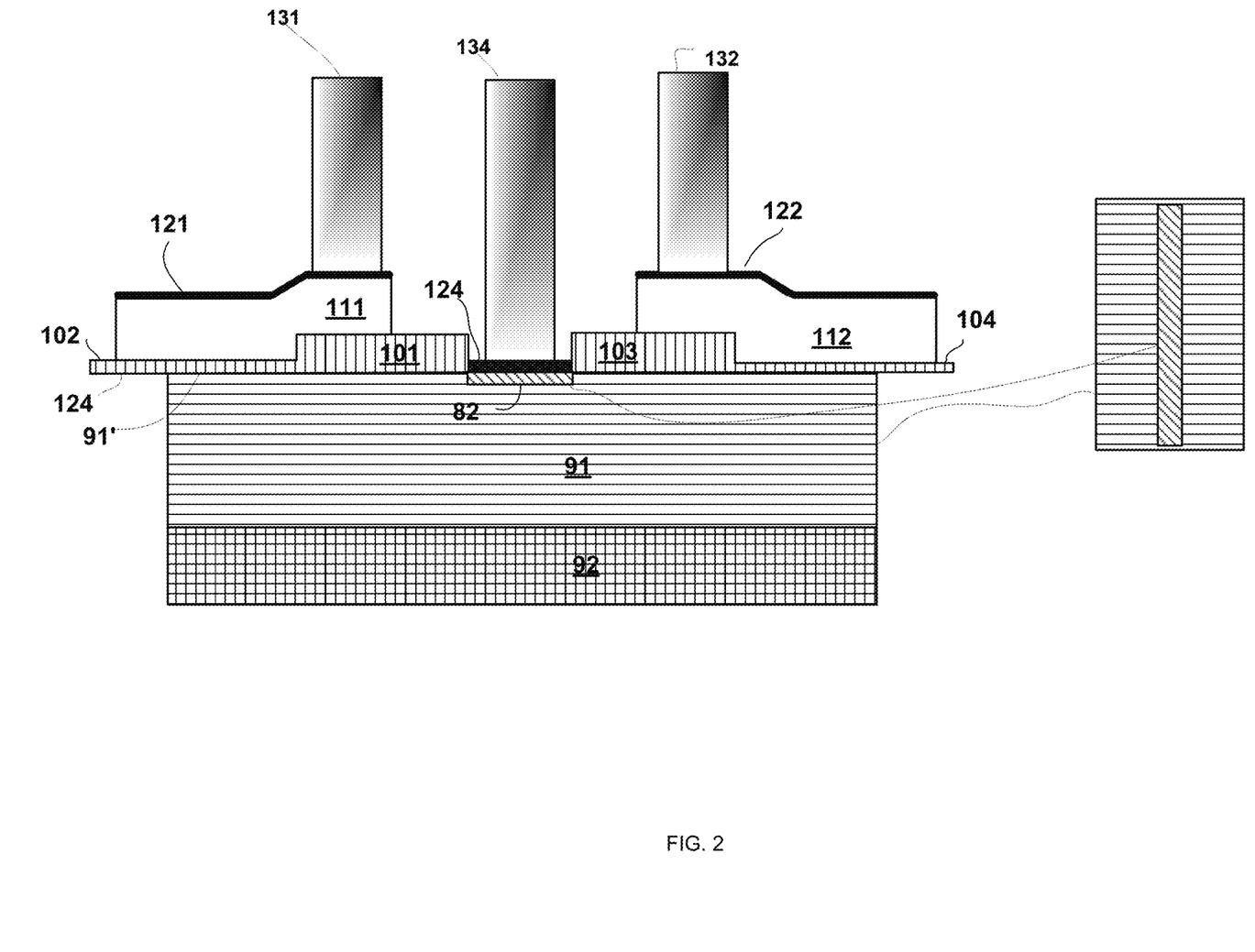
FIG. 2 is example of a part of a semiconductor device.

There may be provided a LDMOS transistor that may include a first region that is a RESURF implant region of a first type (for simplicity of explanation it is assumed that it is a n-type), a second region that is a RESURF implant region of a second type (for simplicity of explanation it is assumed that it is a p-type), that is positioned below the first region, a stepped oxide region (an oxide region that it thicker than the gate oxide region), and a gate. The stepped oxide region is positioned between the first region and the gate. In FIGS. 1 and 2 the first region is denoted 91, the second region is denoted 92, the stepped oxide region is denoted 101 and is thicker than gate oxide region 102. The gate is denoted 111.

The first region and the second region have a substantially uniform thickness.

An upper surface of the first SRF region may contact a planar bottom surface of the stepped oxide region. The upper surface may span across at least a majority of the area of the first region. At least a majority may mean at least 51, 55, 60, 65, 70, 75, 80, 90, 95 of the area.

The LDMOS transistor may include a contact region (for example a drain contact region—denoted 124 in FIGS. 1 and 2) that has a thickness that is a fraction (for example less than 1/X, wherein X may exceed three, four, five, six, and above) of a thickness of the first region. An upper surface (denoted 91' in FIG. 2) of the first region and an upper surface of the drain contact region contact a planar bottom surface (denoted 102' in FIG. 2) of the stepped oxide region.

The first region and the second region may belong to a drain finger of the LDMOS transistor, and the drain may be surrounded (for example from four sides) by the stepped oxide region.

The LDMOS transistor may also include a shallow trench isolation region (denoted 62 in FIG. 1) that is spaced apart from the first region and from the second region.

The LDMOS transistor may include a shallow trench isolation region, one or more source contact regions, and a source body region that contacts the source contact region. The one or more source contact regions and the source body region may be positioned between the shallow trench isolation region and the first SRF region. In FIG. 1 the source contact regions are denoted 81 and 71 and the source body region is denoted 51.

The upper surface of the source contact region and an upper surface of the first region may be located at a same plane. This is shown in FIG. 1.

The LDMOS transistor may include multiple sources, multiple drains and multiple gates. This is shown in FIGS. 3-6.

The drains and sources may be shared between fingers. For example—assuming that there are two external sources (that are proximate to the STI) then each internal source and each drains may be shared between two fingers.

The multiple sources, multiple drains and multiple gates are surrounded by a shallow trench isolation region. This is shown in FIGS. 3-6.

The multiple sources, multiple drains and multiple gates may be located in an area of the LDMOS transistor that is without a shallow trench isolation region. This is shown in FIGS. 3-6.

The LDMOS transistor may include multiple drains and multiple sources.

Figure 5:
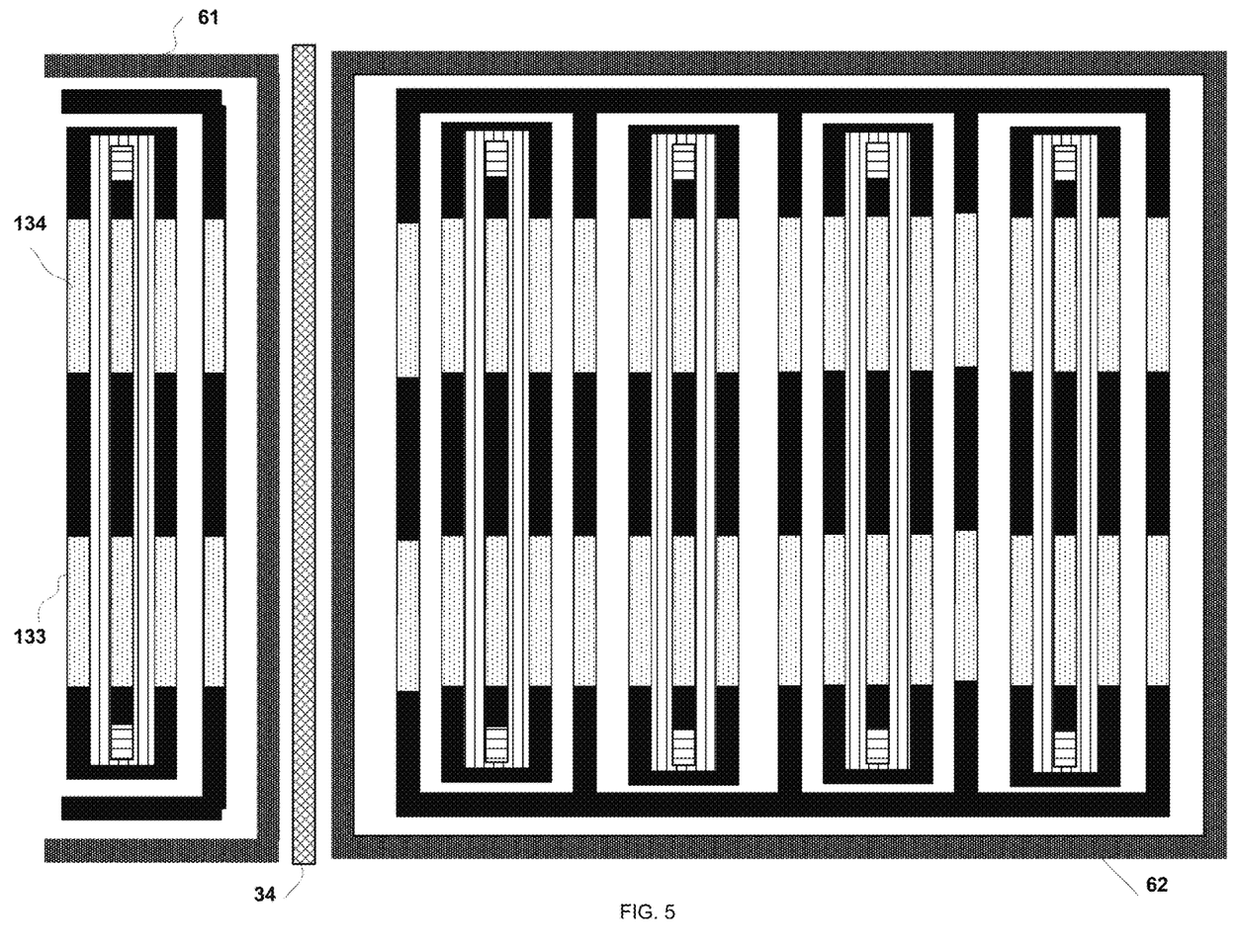
FIG. 5 is example of a part of a semiconductor device.
Figure 6:
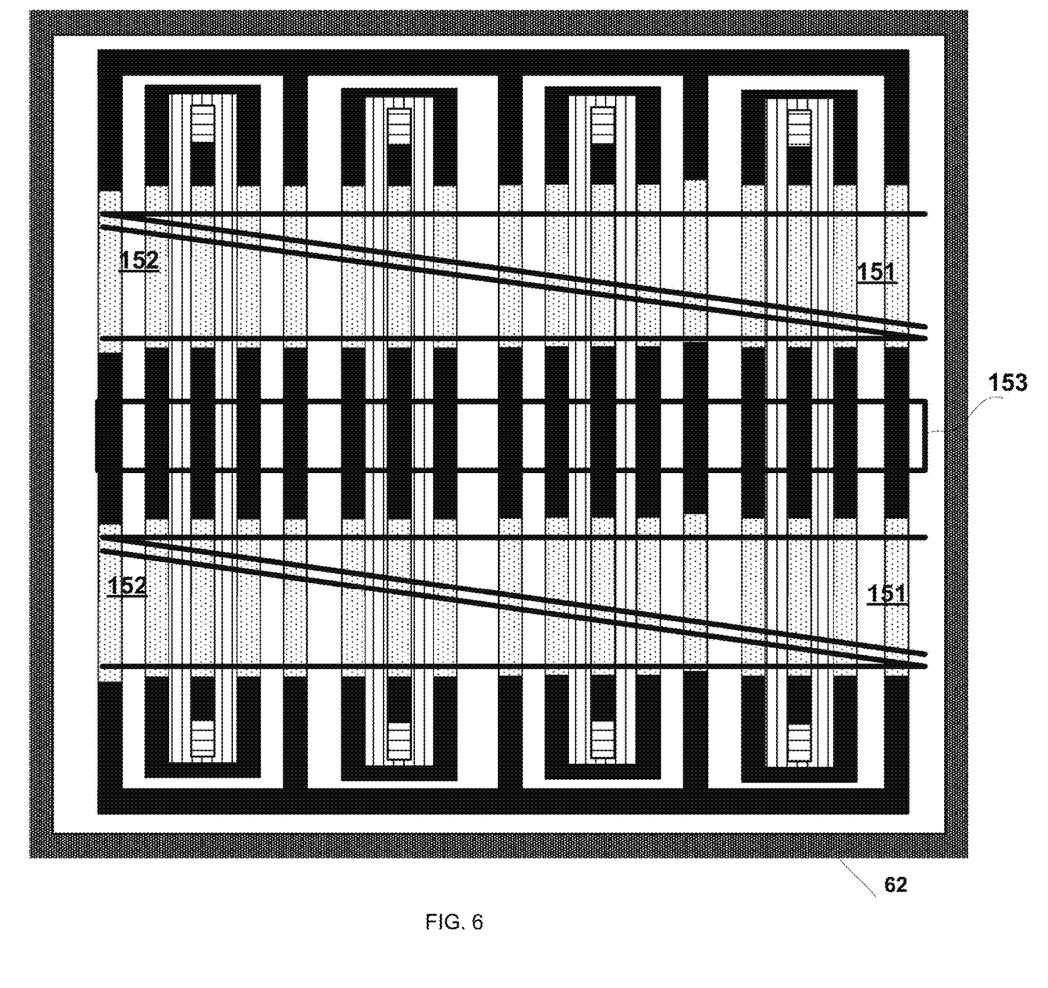
FIG. 6 is example of a part of a semiconductor device.

The drains may be least partially covered by drain metal elements that are electrically coupled from each other. This is shown in FIGS. 1,2 and 5.

Figure 4:
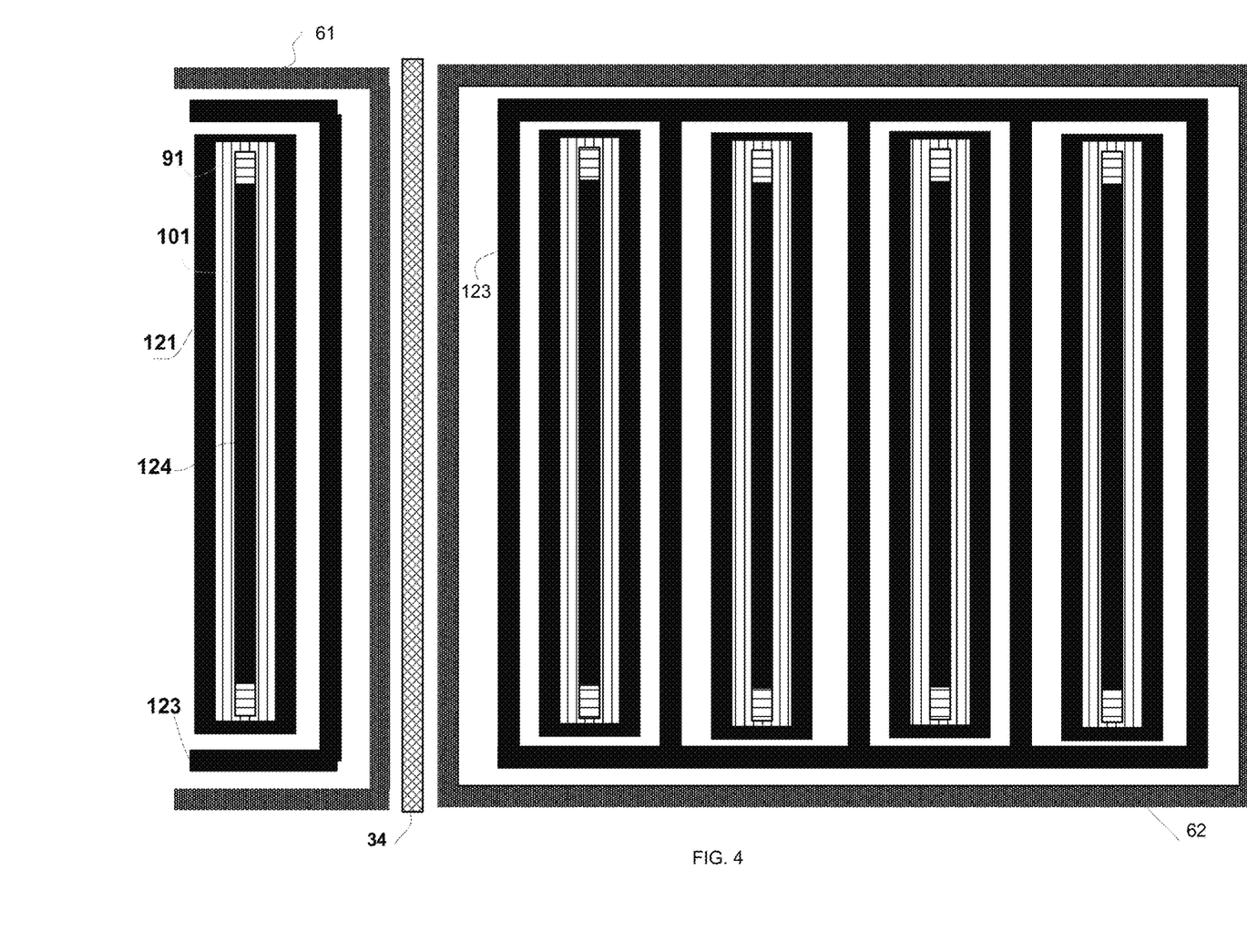
FIG. 4 is example of a part of a semiconductor device.

The sources may be at least partially covered by source metal elements that are electrically coupled from each other, and wherein the source metal elements are isolated from the drain metal elements. This is shown in FIG. 4.

Referring back to FIG. 1 that illustrates a part 11 of a device. Part 11 includes a portion of a first transistor and a portion of a second transistor.

From bottom to top, part 11 includes:
a. A first layer 20 that is a p-type substrate layer.
b. A second layer 32 that is an N-type isolation layer.
c. A third layer that includes (from left to right)—first p-type substrate region 41, n-type well region 34, second p-type substrate region 43, a second region (in this example p-type) region 92, third p-type substrate region 45.
d. A fourth layer that includes (from left to right)—fourth p-type substrate region 42, n-type well region 34, fifth p-type substrate region 44, first p-type well region 51, first region (in this example—n-type) 91, second p-type well region 52.
  i. First STI region 61 is formed within the upper portion of fourth p-type substrate region 42.
  ii. Second STI region 62 is formed within the upper portion of fifth p-type substrate region 44.
  iii. Highly doped p-type (P++) source contact region 71 and highly doped n-type (N++) source contact region 72 are formed within the upper portion of first p-type well region 51.
  iv. Drain contact region 82 is formed within the upper portion of the first region 91.
  v. Highly doped p-type (P++) source contact region 72 and highly doped n-type (N++) source contact regions 83 and 84 are formed within the upper portion of second p-type well region 52.
e. Above the surface of the fourth layer there are stepped oxide region 101, gate oxide region 102, drain metal element 124, source metal elements 123, gate 111, gate metal elements 121, conductors such as first till fourth vias 131, 132, 133 and 134.

Figure 3:
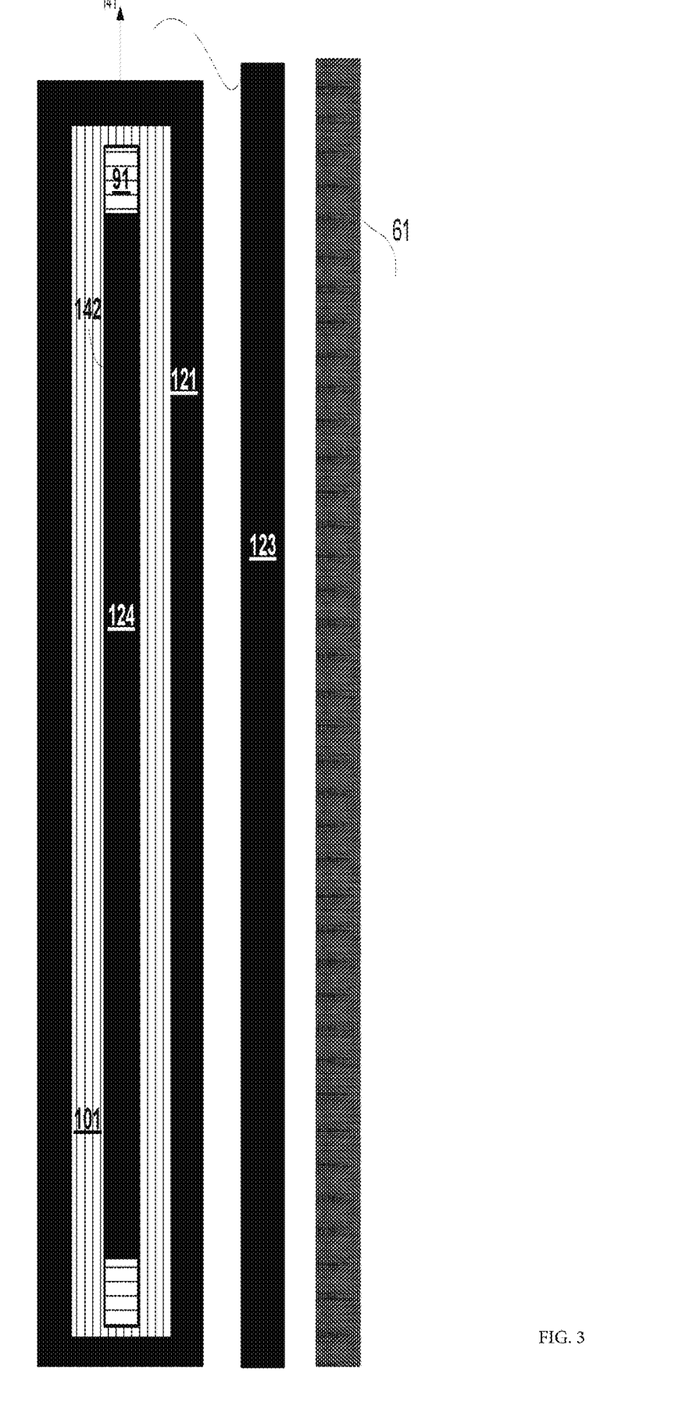
FIG. 3 is example of a voltage distribution over a part of a semiconductor device.

FIG. 3 illustrates a drain, source and gate of a LDMOS transistor and a voltage distribution over a LDMOS transistor 12 of a semiconductor device.

The drain metal element 142 is maintained in a high voltage (to form a high voltage area 14) while the source metal elements 123 are maintained in a lower voltage (for example zero voltage—to form a low voltage area 141). The STI region 62 is closer to the low voltage area 141 in relation to the high voltage area 142.

FIG. 4 is a top view of a part of a semiconductor device after the formation of drain metal elements 124, gate metal elements 121 and source metal elements 123.

It should be noted that the drain metal elements are electrically coupled to each other. These drain metal elements may mask the drain regions (for example first regions 91) located below these drain metal elements.

The source metal elements are electrically coupled to each other. These source metal elements may mask the source regions below these source metal elements.

The gate metal elements are electrically coupled to each other. These gate metal elements may mask the gate regions below these gate metal elements.

FIG. 4 is a top view of a part of a semiconductor device after the formation of vias (such as via 134 and 133). FIG.

4 also illustrates a virtual axis 150. The cross sectional view of FIG. 1 was taken along the virtual axis 150.

FIG. 5 is a top view of a part of a semiconductor device after the formation of a higher metal layer (for example a second metal layer M2)—that include metal pick up lines such as M2 drain conductors 151, M2 source conductors 152 and M2 gate conductors 153. The M2 conductors are coupled to the relevant metal elements by intermediate conductors (not shown). The metal pick up lines may be located at one or more other metal layers.

The gate metal pick up lines may be positioned between rows and may be restricted from the first metal level where they pass above a non-metallic region.

A M2 drain conductor 151 may be connected (or otherwise electrically coupled—by a via) only to a corresponding drain metal element 124. A M2 source conductor 152 may be connected (or otherwise electrically coupled) only to a corresponding source metal element 123. A M2 gate conductor 153 may be connected (or otherwise electrically coupled) only to a corresponding gate metal element 121.

The distance between the M2 conductors and the first and second RST regions as well as masking provided by the source and drain metal elements—dramatically reduce any effect of the M2 conductors in the uniformity of the electrical field above the first and second RST regions.

The suggested LDMOS transistor may have an arbitrary long L-direction length and may have any number of conductors such as gate metal pick-up lines which are restricted to higher metal layers (M2 and above) that are located above intermediate regions located above the metal elements (for example—non-silicide region above a silicide elements) and are allow to reach the gate without affecting the device electrostatic balance.

The suggested LDMOS transistor may provide an optimized charge balance across the entire regions. The regions are spaced apart from the STI regions. The STI regions are spaced apart from high voltage and high current regions such as the regions.

Any reference to any of the terms "comprise", "comprises", "comprising" "including", "may include" and "includes" may be applied to any of the terms "consists", "consisting", "consisting essentially of". For example—any of the rectifying circuits illustrated in any figure may include more components that those illustrated in the figure, only the components illustrated in the figure or substantially only the components illustrate din the figure.

In the foregoing specification, the invention has been described with reference to specific examples of embodiments of the invention. It will, however, be evident that various modifications and changes may be made therein without departing from the broader spirit and scope of the invention as set forth in the appended claims. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A lateral diffused metal oxide semiconductor field effect (LDMOS) transistor, comprising:
   multiple sources;
   multiple drains; and
   multiple instances of:
      a first region that is a reduced surface field (RESURF) implant region of a first type;
      a second region that is a RESURF implant region of a second type, wherein the first type differs from the second type;
      a gate;

a stepped oxide region and a gate oxide region that are positioned above the first region and below the gate;

wherein each one of the first region and the second region has a substantially uniform thickness; and wherein the multiple drains are surrounded by the multiple sources which in turn are surrounded by a shallow trench isolation region;

wherein the multiple drains are at least partially covered by drain metal elements that are electrically coupled to each other;

wherein the multiple sources are at least partially covered by source metal elements that are electrically coupled from each other; and wherein the source metal elements are isolated from the drain metal elements.

2. The LDMOS transistor according to claim 1, wherein for each of the multiple instances, an upper surface of the first region spans across at least a majority of an area of first region.

3. The LDMOS transistor according to claim 1, wherein each of the multiple drains comprises drain contact region that has a thickness that is a fraction of a thickness of the first region of an instance of the multiple instances, wherein an upper surface of the first region and an upper surface of the drain contact region contact a planar bottom surface of the stepped oxide region.

4. The LDMOS transistor according to claim 1, wherein each source of the multiple sources comprises a source contact region, wherein source contact regions of the multiple sources are connected to each other.

5. The LDMOS transistor according to claim 1, wherein each of the multiple sources comprises a source contact region, and a source body region that contacts the source contact region.

6. The LDMOS transistor according to claim 5, wherein for each of the multiple sources, an upper surface of the source contact region and an upper surface of the first region are located at a same plane.

7. The LDMOS transistor according to claim 1, wherein the multiple sources and the multiple drains are located in an area of the LDMOS transistor that is without the shallow trench isolation region.

8. The LDMOS transistor according to claim 1 further comprising multiple gates that are at least partially covered by gate metal elements.

9. The LDMOS transistor according to claim 8 wherein the gate metal elements are electrically coupled to gate metal pickup lines.

10. The LDMOS transistor according to claim 9 wherein the gate metal pickup lines are connected to the gate metal elements and are disconnected to any other part of the gate.

\* \* \* \* \*